United States Patent
Nakanishi (10) Patent No.: US 10,345,603 B2
(45) Date of Patent: *Jul. 9, 2019

(54) OPTICAL MODULE WITH LIGHT-RECEIVING DEVICE AND LIGHT-EMITTING DEVICE MOUNTED ON A BASE MEMBER

(71) Applicant: Sumitomo Electric Industries, Ltd., Osaka-shi (JP)

(72) Inventor: Hiromi Nakanishi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 187 days.

This patent is subject to a terminal disclaimer.

(21) Appl. No.: 15/526,591

(22) PCT Filed: Oct. 27, 2015

(86) PCT No.: PCT/JP2015/080206
§ 371 (c)(1),
(2) Date: May 12, 2017

(87) PCT Pub. No.: WO2016/076105
PCT Pub. Date: May 19, 2016

(65) Prior Publication Data
US 2017/0315368 A1    Nov. 2, 2017

(30) Foreign Application Priority Data
Nov. 13, 2014  (JP) .................. 2014-230838

(51) Int. Cl.
*G02B 6/42*     (2006.01)
*G02B 27/09*    (2006.01)
(Continued)

(52) U.S. Cl.
CPC ..... *G02B 27/0916* (2013.01); *G02B 27/0905* (2013.01); *G02B 27/0955* (2013.01);
(Continued)

(58) Field of Classification Search
CPC ............ G02B 27/0916; G02B 27/0955; G02B 6/4246; G02B 27/0905; G02B 6/4251; H01S 5/4093; H01S 5/4012
(Continued)

(56) References Cited

U.S. PATENT DOCUMENTS

| | | | | |
|---|---|---|---|---|
| 4,614,958 A | * | 9/1986 | Mikami | ............... G02B 6/4246 |
| | | | | 250/227.14 |
| 9,977,201 B2 | * | 5/2018 | Enya | ..................... F21S 41/147 |
| 2014/0240952 A1 | | 8/2014 | Nakanishi et al. | |

FOREIGN PATENT DOCUMENTS

| | | |
|---|---|---|
| CN | 1316669 A | 10/2001 |
| CN | 104020569 A | 9/2014 |

(Continued)

OTHER PUBLICATIONS

Notice of Allowance dated Mar. 16, 2018 in related U.S. Appl. No. 15/647,491.
(Continued)

*Primary Examiner* — Que Tan Le
(74) *Attorney, Agent, or Firm* — Baker Botts LLP; Michael A. Sartori (57) ABSTRACT

An optical module includes a light-forming part and a protective member. The light-forming part includes a base member; semiconductor light-emitting devices mounted on the base member; lenses mounted on the base member and configured to convert, in terms of spot size, light emitted from the semiconductor light-emitting devices; and light-receiving devices that are mounted on the base member, that are disposed, in the emission directions of the semiconduc-
(Continued)

tor light-emitting devices, between the semiconductor light-emitting devices and the lenses, and that are configured to directly receive light from the semiconductor light-emitting devices.

7 Claims, 7 Drawing Sheets

(51) Int. Cl.
    *G02B 27/10*     (2006.01)
    *G02B 27/14*     (2006.01)
    *H01S 5/40*     (2006.01)
    *H01S 5/0683*     (2006.01)
    *H01S 5/022*     (2006.01)
    *H01S 5/024*     (2006.01)

(52) U.S. Cl.
    CPC ....... *G02B 27/1006* (2013.01); *G02B 27/141* (2013.01); *H01S 5/4093* (2013.01); *H01S 5/02216* (2013.01); *H01S 5/02248* (2013.01); *H01S 5/02415* (2013.01); *H01S 5/0683* (2013.01)

(58) Field of Classification Search
    USPC .................................................. 250/205, 239
    See application file for complete search history.

(56) References Cited

FOREIGN PATENT DOCUMENTS

| | | | |
|---|---|---|---|
| EP | 1139137 | A2 | 10/2001 |
| JP | 61-095590 | A | 5/1986 |
| JP | H09-055705 | A | 2/1997 |
| JP | 2000-031575 | A | 1/2000 |
| JP | 2001-284694 | A | 10/2001 |
| JP | 2004-165299 | A | 6/2004 |
| JP | 2007-017925 | A | 1/2007 |
| JP | 2007-065600 | A | 3/2007 |
| JP | 2007-328895 | A | 12/2007 |
| JP | 2009-093101 | A | 4/2009 |
| JP | 2014-168021 | A | 9/2014 |
| JP | 2016-096219 | A | 5/2016 |

OTHER PUBLICATIONS

Notification of First Office Action of the counterpart Chinese Patent Application No. 201580061601.6, dated Nov. 20, 2018.
Han, Wei et al., "Fiber Optic Cable Technology", pp. 52-55, Oct. 1997.

\* cited by examiner

OPTICAL MODULE WITH LIGHT-RECEIVING DEVICE AND LIGHT-EMITTING DEVICE MOUNTED ON A BASE MEMBER

TECHNICAL FIELD

The present invention relates to an optical module.

BACKGROUND ART

There are known optical modules that include semiconductor light-emitting devices within packages (for example, refer to Patent Literatures 1 to 4). Such optical modules are used as light sources of various apparatuses such as display apparatuses, optical pickup apparatuses, and optical communication apparatuses.

In such an optical module, the intensity of light emitted from the semiconductor light-emitting device needs to be appropriately adjusted. The intensity of the light can be adjusted by receiving, with a light-receiving device, a portion of the light emitted from the semiconductor light-emitting device to determine the intensity of the light, and by adjusting, on the basis of feedback of the determined intensity, the electric power supplied to the semiconductor light-emitting device. A structure that sends a portion of light emitted from the semiconductor light-emitting device to the light-receiving device is, for example, a structure in which optical components such as a filter and a mirror are used to separate a portion of light emitted from the semiconductor light-emitting device and to send the separated portion of light to the light-receiving device (for example, refer to Patent Literatures 1 and 2).

CITATION LIST

Patent Literature

PTL 1: Japanese Unexamined Patent Application Publication No. 2009-93101
PTL 2: Japanese Unexamined Patent Application Publication No. 2007-328895
PTL 3: Japanese Unexamined Patent Application Publication No. 2007-17925
PTL 4: Japanese Unexamined Patent Application Publication No. 2007-65600

SUMMARY OF INVENTION

Technical Problem

Since apparatuses including such optical modules have come to have higher performance and have come to be used in wider applications, there has been a demand for more accurate adjustment of the intensity of light emitted from the semiconductor light-emitting devices. Specifically, for example, there has been a demand for, for the purpose of achieving better color reproduction of a display apparatus, adjustment of, with a higher accuracy, the intensities of red light, green light, and blue light individually emitted from semiconductor light-emitting devices.

Accordingly, it is an object to provide an optical module that enables highly accurate adjustment of the intensity of light emitted from a semiconductor light-emitting device.

Solution to Problem

An optical module according to the present invention includes a light-forming part configured to form light; and a protective member that includes an output window configured to transmit light from the light-forming part and that is disposed so as to surround the light-forming part. The light-forming part includes a base member, a semiconductor light-emitting device mounted on the base member, a lens mounted on the base member and configured to convert, in terms of spot size, light emitted from the semiconductor light-emitting device, and a light-receiving device that is mounted on the base member, that is disposed, in an emission direction of the semiconductor light-emitting device, between the semiconductor light-emitting device and the lens, and that is configured to directly receive light from the semiconductor light-emitting device.

Advantageous Effects of Invention

The optical module enables highly accurate adjustment of the intensity of light emitted from a semiconductor light-emitting device.

DESCRIPTION OF EMBODIMENTS

Description of Embodiments of Invention of the Present Application

Embodiments according to the invention of the present application will be first listed and described. An optical module according to the present application includes a light-forming part configured to form light; and a protective member that includes an output window configured to transmit light from the light-forming part and that is disposed so as to surround the light-forming part. The light-forming part includes a base member, a semiconductor light-emitting device mounted on the base member, a lens mounted on the base member and configured to convert, in terms of spot size, light emitted from the semiconductor light-emitting device, and a light-receiving device that is mounted on the base member, that is disposed, in an emission direction of the semiconductor light-emitting device, between the semiconductor light-emitting device and the lens, and that is configured to directly receive light from the semiconductor light-emitting device.

An optical module according to the present application has a structure in which a single protective member surrounds a light-forming part including a semiconductor light-emitting device, a lens, and a light-receiving device that are disposed on a single base member. In other words, the optical module has a structure in which the semiconductor light-emitting device, the lens, and the light-receiving device are mounted within a single package. In an optical module according to the present application, within the single package, light emitted from the semiconductor light-emitting device is directly received by the light-receiving device, which is disposed between the semiconductor light-emitting device and the lens. Thus, the intensity of the light can be accurately determined, compared with the case of using optical components such as a filter and a mirror to separate a portion of light emitted from the semiconductor light-emitting device and sending the separated portion of light to the light-receiving device. As a result, an optical module according to the present application enables highly accurate adjustment of the intensity of light emitted from the semiconductor light-emitting device.

In the above-described optical module, the light-forming part may include a plurality of the semiconductor light-emitting devices mounted on the base member, a plurality of the lenses mounted on the base member and disposed so as to individually correspond to the plurality of semiconductor light-emitting devices, the light-receiving device mounted on the base member and disposed so as to correspond to at least one semiconductor light-emitting device of the plurality of semiconductor light-emitting devices, and a filter mounted on the base member and configured to multiplex light from the plurality of semiconductor light-emitting devices.

In this case, plural semiconductor light-emitting devices are disposed within a single package and light from these semiconductor light-emitting devices can be multiplexed within the package. This configuration enables a reduction in the size of an apparatus including the optical module, compared with a case of multiplexing light from plural packages.

Incidentally, examples of the filter include wavelength selective filters and polarization synthesizing filters.

In the above-described optical module, the plurality of semiconductor light-emitting devices may include a semiconductor light-emitting device configured to emit red light, a semiconductor light-emitting device configured to emit green light, and a semiconductor light-emitting device configured to emit blue light. This configuration enables multiplexing of such light to form light of a desired color.

In the above-described optical module, the light-receiving device is disposed at a position so as to receive, of light emitted from the at least one semiconductor light-emitting device, light in a region other than a region where light is converted in terms of spot size by the lens corresponding to the at least one semiconductor light-emitting device.

Such a structure is employed in which light that is not converted in terms of spot size by the lens, that is, light in a region that is not used as light emitted from the optical module is received by the light-receiving device. This structure enables determination of the intensity of light emitted from the semiconductor light-emitting device without decreasing the amount of light emitted from the optical module. This structure is employed in the above-described structure in which plural semiconductor light-emitting devices are disposed within a single package and light from these semiconductor light-emitting devices are multiplexed within the package, so that the intensity of light emitted from the semiconductor light-emitting devices can be more accurately adjusted. The reason for this is as follows.

In the case of employing the structure in which plural semiconductor light-emitting devices are disposed within a single package and light from these semiconductor light-emitting devices is multiplexed within the package, a phenomenon called optical crosstalk occurs in which a light-receiving device provided to receive light emitted from one of the semiconductor light-emitting devices also receives light emitted from another semiconductor light-emitting device. Because of this crosstalk, the intensity of light from the semiconductor light-emitting device, the intensity being supposed to be determined by the light-receiving device, cannot be accurately determined, which is problematic.

According to studies performed by the inventors of the present invention, the biggest cause of the crosstalk is as follows: a light-receiving device provided to receive light emitted from one of the semiconductor light-emitting devices, also receives light (stray light) that is emitted from another semiconductor light-emitting device, reflected by the inner wall of the protective member, and travels along an optical path for light emitted from the one semiconductor light-emitting device. Since the stray light travels along the optical path for the light emitted from the one semiconductor light-emitting device, the stray light travels through the region subjected to spot-size conversion using a lens corresponding to the one semiconductor light-emitting device. In other words, in an area between the at least one semiconductor light-emitting device and its corresponding lens, the stray light from another semiconductor light-emitting device does not enter a region other than a region subjected to spot-size conversion using the lens corresponding to the at least one semiconductor light-emitting device. For this reason, when the light-receiving device is disposed at a position so as to receive, of light emitted from the at least one semiconductor light-emitting device, light in a region other than a region subjected to spot-size conversion using a lens corresponding to the at least one semiconductor light-emitting device, occurrence of crosstalk can be suppressed. As a result, the intensity of light emitted from such a semiconductor light-emitting device can be more accurately adjusted.

In the above-described optical module, the light-receiving device may be disposed at a position where light emitted from the at least one semiconductor light-emitting device is received to provide a photocurrent of 1 µA or more.

In this case, the intensity of light from such a semiconductor light-emitting device can be accurately determined. In order to more accurately determine the intensity of light from the semiconductor light-emitting device, the light-receiving device may be disposed at a position where the photocurrent is 10 µA or more.

In the above-described optical module, the semiconductor light-emitting device may be a laser diode.

In this case, emitted light having less variation in the wavelength can be obtained.

In the above-described optical module, the light-forming part may further include an electronic cooling module disposed so as to be in contact with the base member. In this case, the optical module is usable even in an environment in which the temperature can reach a high value.

Details of Embodiments of Invention of the Present Application

Embodiment 1

Figure 1:
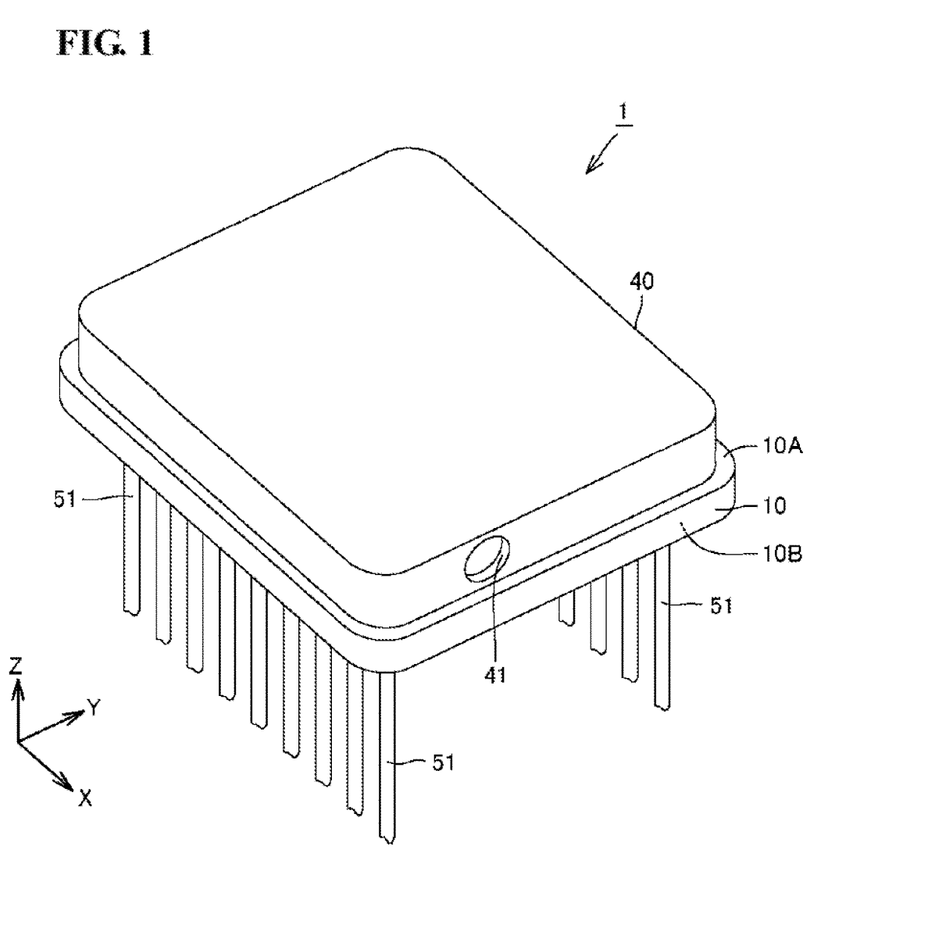
FIG. 1 is a schematic perspective view illustrating the structure of an optical module according to Embodiment 1.
Figure 2:
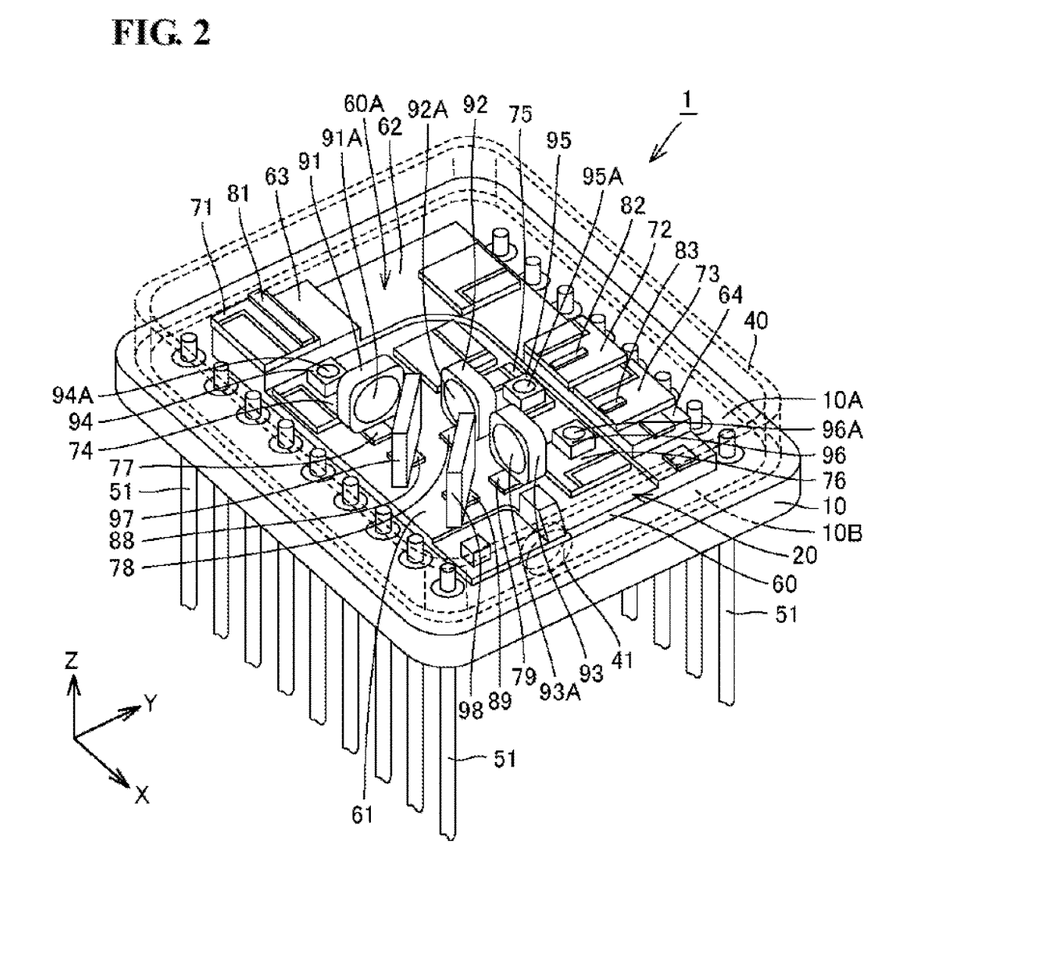
FIG. 2 is a schematic perspective view illustrating the structure of an optical module according to Embodiment 1.

Hereinafter, Embodiment 1, which relates to an optical module according to an embodiment of the present invention, will be described with reference to FIG. 1 to FIG. 5. FIG. 2 corresponds to a state in which a cap 40 in FIG. 1 is detached. In the drawings below, like or corresponding elements are denoted by like reference numerals and redundant descriptions thereof will be omitted.

Referring to FIG. 1 and FIG. 2, an optical module 1 according to this embodiment includes a stem 10 having the shape of a flat plate; a light-forming part 20 disposed on one main surface 10A of the stem 10 and configured to form light; a cap 40 disposed on and in contact with the one main surface 10A of the stem 10 so as to cover the light-forming part 20; and plural lead pins 51 that extend through the stem 10 from the other main surface 10B side to the one main surface 10A side and protrude from both of the one main surface 10A and the other main surface 10B. The stem 10 and the cap 40 are, for example, welded together to provide a hermetically sealed state. In other words, the light-forming part 20 is hermetically sealed by the stem 10 and the cap 40. The space surrounded by the stem 10 and the cap 40 contains, for example, a gas having a reduced water content (moisture is removed), such as dry air. The cap 40 has an output window 41, which transmits light from the light-forming part 20. The output window may have the shape of a flat plate whose main surfaces are parallel to each other, or may have the shape of a lens that condenses or diffuses light from the light-forming part 20. The stem 10 and the cap 40 constitute a protective member.

Figure 3:
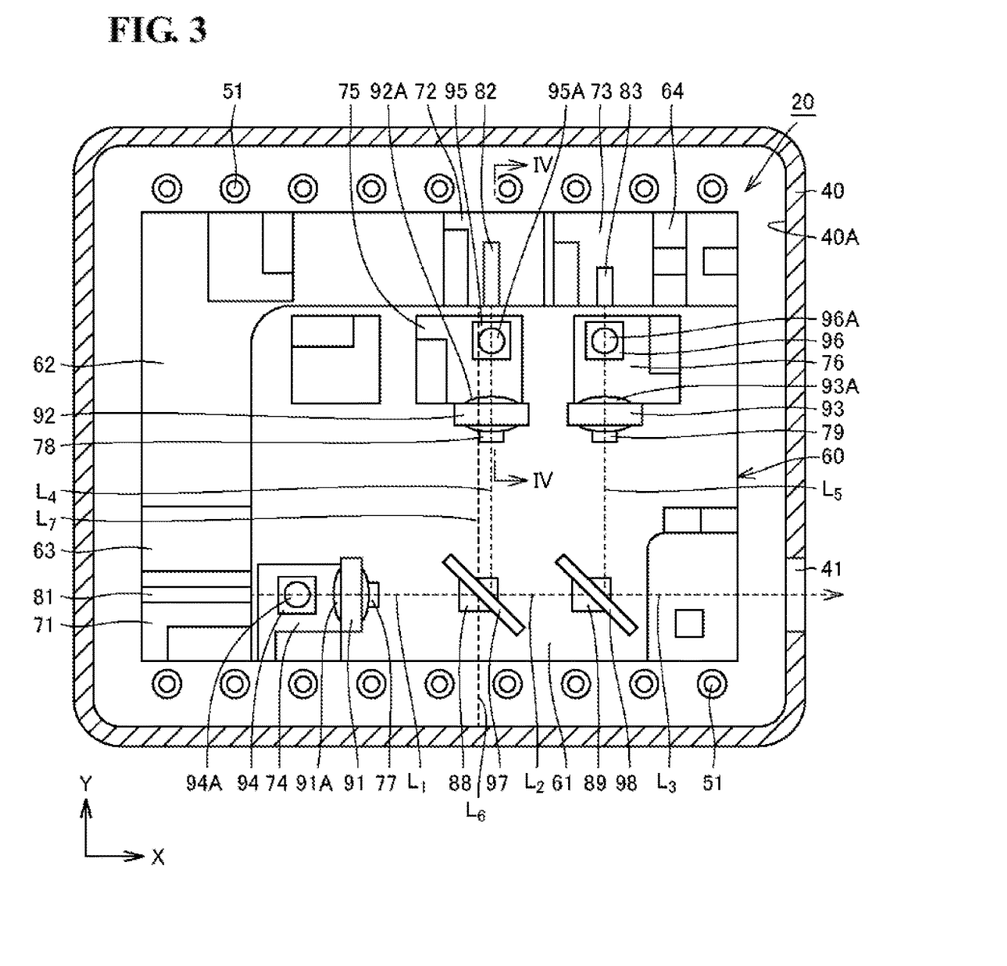
FIG. 3 is a schematic plan view illustrating the structure of an optical module according to Embodiment 1.

Referring to FIG. 2 and FIG. 3, the light-forming part 20 includes a base plate 60, which is a base member having the shape of a plate. The base plate 60 has one main surface 60A, which has a rectangular shape in plan view. The base plate 60 includes a base region 61 and a chip mount region 62. The chip mount region 62 is formed in a region including one short side of the one main surface 60A and one long side connected to the one short side. The chip mount region 62 has a larger thickness than the base region 61. As a result, the chip mount region 62 has a larger height than the base region 61. The chip mount region 62 includes a first chip mount region 63, which is formed in a region on a side of the one short side opposite to the other side where the one short side is connected to the one long side, and which has a larger thickness (larger height) than the adjacent region. The chip mount region 62 includes a second chip mount region 64, which is formed in a region on a side of the one long side opposite to the other side where the one long side is connected to the one short side, and which has a larger thickness (larger height) than the adjacent region.

On the first chip mount region 63, a first submount 71 having the shape of a flat plate is disposed. On the first submount 71, a red laser diode 81 is disposed as a first semiconductor light-emitting device. On the other hand, on the second chip mount region 64, a second submount 72 and a third submount 73 each having the shape of a flat plate are disposed. When viewed from the second submount 72, the third submount 73 is disposed on a side opposite to the other side where the one long side and the one short side are connected together. On the second submount 72, a green laser diode 82 is disposed as a second semiconductor light-emitting device. On the third submount 73, a blue laser diode 83 is disposed as a third semiconductor light-emitting device. The heights of the optical axes of the red laser diode 81, the green laser diode 82, and the blue laser diode 83 (the distances between each optical axis and a reference surface that is the one main surface 60A of the base plate 60; the distances from the reference surface in the Z-axis direction) are adjusted to be the same by the first submount 71, the second submount 72, and the third submount 73.

On the base region 61 of the base plate 60, a fourth submount 74, a fifth submount 75, and a sixth submount 76 are disposed. On the fourth submount 74, the fifth submount 75, and the sixth submount 76, respectively, a first photodiode 94 as a first light-receiving device, a second photodiode 95 as a second light-receiving device, and a third photodiode 96 as a third light-receiving device are disposed. The fourth submount 74, the fifth submount 75, and the sixth submount 76 are respectively used to adjust the heights of the first photodiode 94, the second photodiode 95, and the third photodiode 96 (the distances to the optical axes of the red laser diode 81, the green laser diode 82, and the blue laser diode 83; the distances in the Z-axis direction). Details of the adjustment of the heights of the first photodiode 94, the second photodiode 95, and the third photodiode 96 will be described later. The first photodiode 94, the second photodiode 95, and the third photodiode 96 are respectively disposed at positions where they directly receive light from the red laser diode 81, the green laser diode 82, and the blue laser diode 83. In this embodiment, the light-receiving devices are disposed so as to individually correspond to all the semiconductor light-emitting devices. The first photodiode 94, the second photodiode 95, and the third photodiode 96 are photodiodes respectively configured to receive red light, green light, and blue light. The first photodiode 94 is disposed, in the emission direction of the red laser diode 81, between the red laser diode 81 and a first lens 91. The second photodiode 95 is disposed, in the emission direction of the green laser diode 82, between the green laser diode 82 and a second lens 92. The third photodiode 96 is disposed, in the emission direction of the blue laser diode 83, between the blue laser diode 83 and a third lens 93.

On the base region 61 of the base plate 60, a first lens holding part 77, a second lens holding part 78, and a third lens holding part 79 that are protrusion parts are formed. On the first lens holding part 77, the second lens holding part 78, and the third lens holding part 79, respectively, the first lens 91, the second lens 92, and the third lens 93 are disposed. The first lens 91, the second lens 92, and the third lens 93 respectively have lens portions 91A, 92A, and 93A whose surfaces are lens surfaces. The first lens 91, the second lens 92, and the third lens 93 are each molded in one piece in terms of the lens portions 91A, 92A, and 93A and regions other than the lens portions 91A, 92A, and 93A. The first lens holding part 77, the second lens holding part 78, and the third lens holding part 79 are used to adjust the central axes of the lens portions 91A, 92A, and 93A of the first lens 91, the second lens 92, and the third lens 93, that is, the optical axes of the lens portions 91A, 92A, and 93A, so as to respectively align with the optical axes of the red laser diode 81, the green laser diode 82, and the blue laser diode 83. The first lens 91, the second lens 92, and the third lens 93 respectively convert, in terms of spot size, light emitted from the red laser diode 81, the green laser diode 82, and the blue laser diode 83. The first lens 91, the second lens 92, and the third lens 93 are used to convert, in terms of spot size, light emitted from the red laser diode 81, the green laser diode 82, and the blue laser diode 83 such that the resultant spot sizes are the same.

On the base region 61 of the base plate 60, a first filter 97 and a second filter 98 are disposed. The first filter 97 and the second filter 98 each have the shape of a flat plate whose main surfaces are parallel to each other. The first filter 97 and the second filter 98 are, for example, wavelength selective filters. The first filter 97 and the second filter 98 are dielectric multilayer film filters. More specifically, the first filter 97 transmits red light, but reflects green light. The second filter 98 transmits red light and green light, but reflects blue light.

As described above, the first filter 97 and the second filter 98 selectively transmit and reflect light of specific wavelengths. As a result, the first filter 97 and the second filter 98 multiplex light emitted from the red laser diode 81, the green laser diode 82, and the blue laser diode 83. The first filter 97 and the second filter 98 are respectively disposed on a first protrusion region 88 and a second protrusion region 89, which are protrusion parts formed on the base region 61.

Referring to FIG. 3, the red laser diode 81, a light-receiving portion 94A of the first photodiode 94, the lens portion 91A of the first lens 91, the first filter 97, and the second filter 98 are disposed so as to be arranged in a line extending in the emission direction of light from the red laser diode 81 (arranged in the X-axis direction). The green laser diode 82, a light-receiving portion 95A of the second photodiode 95, the lens portion 92A of the second lens 92, and the first filter 97 are disposed so as to be arranged in a line extending in the emission direction of light from the green laser diode 82 (arranged in the Y-axis direction). The blue laser diode 83, a light-receiving portion 96A of the third photodiode 96, the lens portion 93A of the third lens 93, and the second filter 98 are disposed so as to be arranged in a line extending in the emission direction of light from the blue laser diode 83 (arranged in the Y-axis direction). Thus, the emission direction of the red laser diode 81 intersects the emission directions of the green laser diode 82 and the blue laser diode 83. More specifically, the emission direction of the red laser diode 81 is orthogonal to the emission directions of the green laser diode 82 and the blue laser diode 83. The emission direction of the green laser diode 82 corresponds to the emission direction of the blue laser diode 83.

More specifically, the emission direction of the green laser diode 82 is parallel to the emission direction of the blue laser diode 83. The main surfaces of the first filter 97 and the second filter 98 incline with respect to the emission direction of light from the red laser diode 81. More specifically, the main surfaces of the first filter 97 and the second filter 98 incline at 45° with respect to the emission direction of light from the red laser diode 81 (the X-axis direction).

Hereinafter, operations of the optical module 1 according to this embodiment will be described. Referring to FIG. 3, red light emitted from the red laser diode 81 travels along an optical path $L_1$. At this time, a portion of the red light directly enters the light-receiving portion 94A of the first photodiode 94. Thus, the intensity of the red light emitted from the red laser diode 81 is determined; and the intensity of the red light is adjusted on the basis of the difference between the determined intensity of the light and the target intensity of the emitted light. The red light having passed above the first photodiode 94, enters the lens portion 91A of the first lens 91, so that the light is converted in terms of spot size. Specifically, for example, the red light emitted from the red laser diode 81 is converted into collimated light. The red light having been converted in terms of spot size at the first lens 91, travels along the optical path $L_1$, and enters the first filter 97. The first filter 97 transmits red light, so that the light emitted from the red laser diode 81 further travels along an optical path $L_2$, and enters the second filter 98. The second filter 98 transmits red light, so that the light emitted from the red laser diode 81 further travels along an optical path $L_3$, and is outputted through the output window 41 of the cap 40 to the outside of the optical module 1.

Green light emitted from the green laser diode 82 travels along an optical path $L_4$. At this time, a portion of the green light directly enters the light-receiving portion 95A of the second photodiode 95. Thus, the intensity of the green light emitted from the green laser diode 82 is determined; and the intensity of the green light is adjusted on the basis of the difference between the determined intensity of the light and the target intensity of the emitted light. The green light having passed above the second photodiode 95, enters the lens portion 92A of the second lens 92, so that the light is converted in terms of spot size. Specifically, for example, the green light emitted from the green laser diode 82 is converted into collimated light. The green light having been converted in terms of spot size at the second lens 92, travels along the optical path $L_4$, and enters the first filter 97. The first filter 97 reflects green light, so that the light emitted from the green laser diode 82 joins the optical path $L_2$. As a result, the green light is multiplexed with the red light, travels along the optical path $L_2$, and enters the second filter 98. The second filter 98 transmits green light, so that the light emitted from the green laser diode 82 further travels along the optical path $L_3$, and is outputted through the output window 41 of the cap 40 to the outside of the optical module 1.

Blue light emitted from the blue laser diode 83 travels along an optical path $L_5$. At this time, a portion of the blue light directly enters the light-receiving portion 96A of the third photodiode 96. Thus, the intensity of the blue light emitted from the blue laser diode 83 is determined; and the intensity of the blue light is adjusted on the basis of the difference between the determined intensity of the light and the target intensity of the emitted light. The blue light having passed above the third photodiode 96, enters the lens portion 93A of the third lens 93, so that the light is converted in terms of spot size. Specifically, for example, the blue light emitted from the blue laser diode 83 is converted into collimated light. The blue light having been converted in terms of spot size at the third lens 93, travels along the optical path $L_5$, and enters the second filter 98. The second filter 98 reflects blue light, so that the light emitted from the blue laser diode 83 joins the optical path $L_3$. As a result, the blue light is multiplexed with the red light and the green light, travels along the optical path $L_3$, and is outputted through the output window 41 of the cap 40 to the outside of the optical module 1.

In this way, light formed by multiplexing red light, green light, and blue light is outputted through the output window 41 of the cap 40. Note that, in the optical module 1 according to this embodiment, portions of light emitted from the red laser diode 81, the green laser diode 82, and the blue laser diode 83 are directly received by the first photodiode 94, the second photodiode 95, and the third photodiode 96, which are respectively disposed between the red laser diode 81, the green laser diode 82, and the blue laser diode 83 and the first lens 91, the second lens 92, and the third lens 93. Accordingly, the intensities of light can be accurately determined, which enables highly accurate adjustment of the intensities of the light. As a result, red light, green light, and blue light in a desired intensity ratio are accurately multiplexed, to thereby accurately form light of a desired color.

Hereinafter, details of adjustment of the heights of the first photodiode 94, the second photodiode 95, and the third photodiode 96 will be described with reference to an example about the second photodiode 95. The positional relationships of the first photodiode 94 and the third photodiode 96 with respect to the red laser diode 81 and the blue laser diode 83 are the same as the following positional relationship of the second photodiode 95 with respect to the green laser diode 82.

Figure 4:
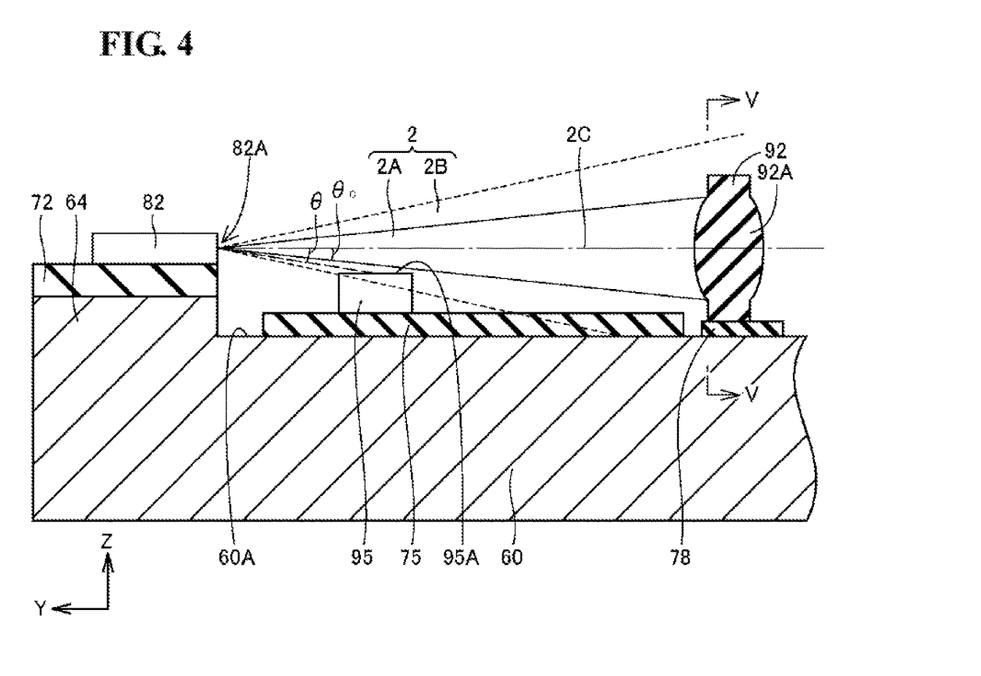
FIG. 4 is a schematic sectional view corresponding to a section taken along line IV-IV in FIG. 3.
Figure 5:
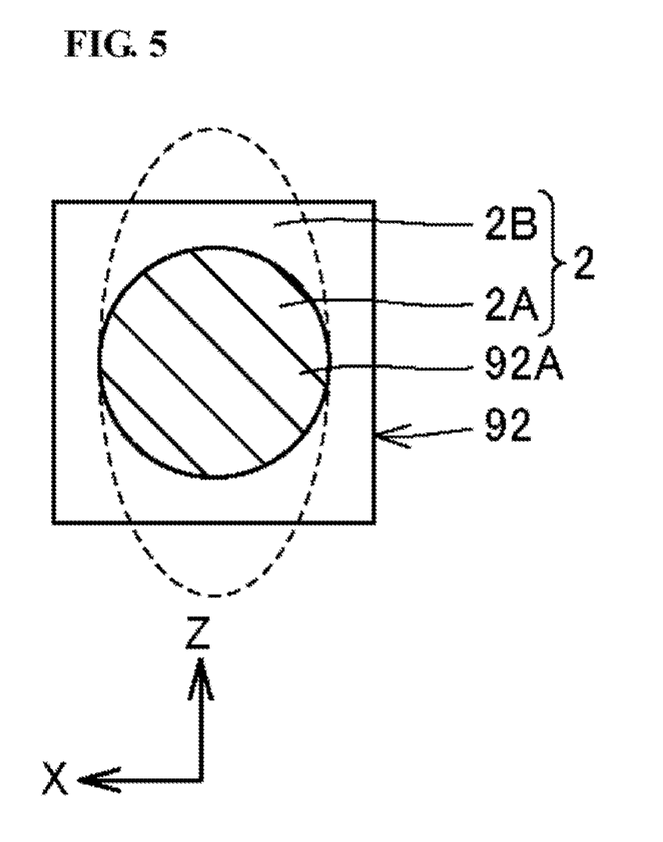
FIG. 5 is a schematic view illustrating the relationship between the shape of light and a lens in a section taken along line V-V in FIG. 4.

Referring to FIG. 4 and FIG. 5, green light 2 emitted from the green laser diode 82 has the shape of an ellipse in a section perpendicular to the optical axis (the section in FIG. 5), the ellipse having a major axis in a direction perpendicular to the one main surface 60A of the base plate 60 (the Z-axis direction). The lens portion 92A of the second lens 92 has the shape of a circle in the section perpendicular to the optical axis. Accordingly, as illustrated in FIG. 5, the second lens 92 is preferably disposed such that, in the section perpendicular to the optical axis, the circle forming the outer circumferential surface of the lens portion 92A is inscribed in the ellipse corresponding to the light 2. In this case, the light 2 includes a region 2A subjected to spot-conversion using the second lens 92, and a region 2B not subjected to the spot-conversion.

Referring to FIG. 4, the second photodiode 95 is disposed such that the light-receiving portion 95A of the second photodiode 95 is configured to receive light in the region 2B, which is the region other than the region 2A subjected to spot-size conversion using the second lens 92. More specifically, angle θ formed by an optical axis 2C of the green laser diode 82 and a line extending between an emission portion 82A of the green laser diode 82 and the light-receiving portion 95A of the second photodiode 95 is adjusted such that the light-receiving portion 95A is configured to receive light in the region 2B, which is the region other than the region 2A subjected to spot-size conversion using the second lens 92. The angle θ can be adjusted by changing the thickness of the fifth submount 75 and the position where the second photodiode 95 is mounted on the fifth submount 75. Thus, such a structure is employed in which light not subjected to spot-size conversion using the second lens 92, that is, light in the region 2B not used as light emitted from the optical module 1, is received by the second photodiode 95. As a result, the intensity of light emitted from the green laser diode 82 can be determined without decreasing the amount of light emitted from the optical module 1.

The second photodiode 95 is disposed in the above-described manner, so that the intensity of light emitted from the green laser diode 82 can be accurately determined. The reason for this will be described below. As described above, in the case of employing a structure in which plural semiconductor light-emitting devices (the red laser diode 81, the green laser diode 82, and the blue laser diode 83) are disposed within a single package and multiplexing light from these diodes, optical crosstalk may occur so that the intensities of light cannot be accurately determined, which is problematic. This problem will be described with reference to a case of determining the intensity of light from the green laser diode 82.

Referring to FIG. 3, the red light emitted from the red laser diode 81 travels along the optical path $L_1$ as described above and is supposed to pass through the first filter 97. However, a portion of the red light is reflected by the first filter 97 and travels along an optical path $L_6$. This light is reflected by an inner wall surface 40A of the cap 40, travels along the optical path $L_6$ to enter and pass through the first filter 97. The light then travels along an optical path $L_7$ and passes through the second lens 92 to reach the second photodiode 95. In this way, red light that is stray light can enter the second photodiode 95, which is supposed to receive the green light. This is the biggest cause of crosstalk.

However, since the red light causing entry of stray light travels along the path of the light emitted from the green laser diode 82 to the first filter 97, the red light passes through the region 2A, which is subjected to spot-size conversion using the lens portion 92A of the second lens 92 (refer to FIG. 4). In other words, in the optical module 1 according to this embodiment in which the second photodiode 95 is disposed so as to receive light in the region 2B, which is the region other than the region 2A subjected to spot-size conversion using the second lens 92, the red light that is stray light traveling along the path is not received by the second photodiode 95. Accordingly, occurrence of crosstalk is suppressed, so that the intensity of light emitted from the green laser diode 82 can be accurately determined and adjusted. The occurrence of crosstalk can be effectively reduced by appropriately adjusting the angle θ. Specifically, the angle θ is adjusted to be equal to or more than an effective angle $θ_0$ of the second lens 92, to thereby effectively reduce the occurrence of crosstalk.

However, when the angle θ is excessively large, though the amount of stray light (red light) received by the second photodiode 95 is sufficiently decreased, the photocurrent obtained from the second photodiode 95 upon receiving of light (green light) decreases, so that it becomes difficult to accurately determine the intensity of light with the second photodiode 95. The angle θ is preferably set such that the value of photocurrent obtained from the second photodiode 95 upon receiving of light is 1 µA or more. In this case, the intensity of light can be accurately determined with the second photodiode 95.

In order to more accurately determine the intensity of light with the second photodiode 95, the second photodiode 95 is preferably disposed at an angle θ adjusted such that the value of photocurrent obtained from the second photodiode 95 upon receiving of light is 10 µA or more.

In the optical module 1 according to this embodiment, the first photodiode 94 corresponding to the red laser diode 81 and the third photodiode 96 corresponding to the blue laser diode 83 are also disposed as with the second photodiode 95 corresponding to the green laser diode 82. Thus, occurrence of crosstalk is suppressed, so that the intensities of red light, green light, and blue light are appropriately adjusted. As a result, light having a desired color can be accurately formed.

Embodiment 2

Hereinafter, Embodiment 2, which relates to an optical module according to another embodiment of the present invention, will be described.

Figure 6:
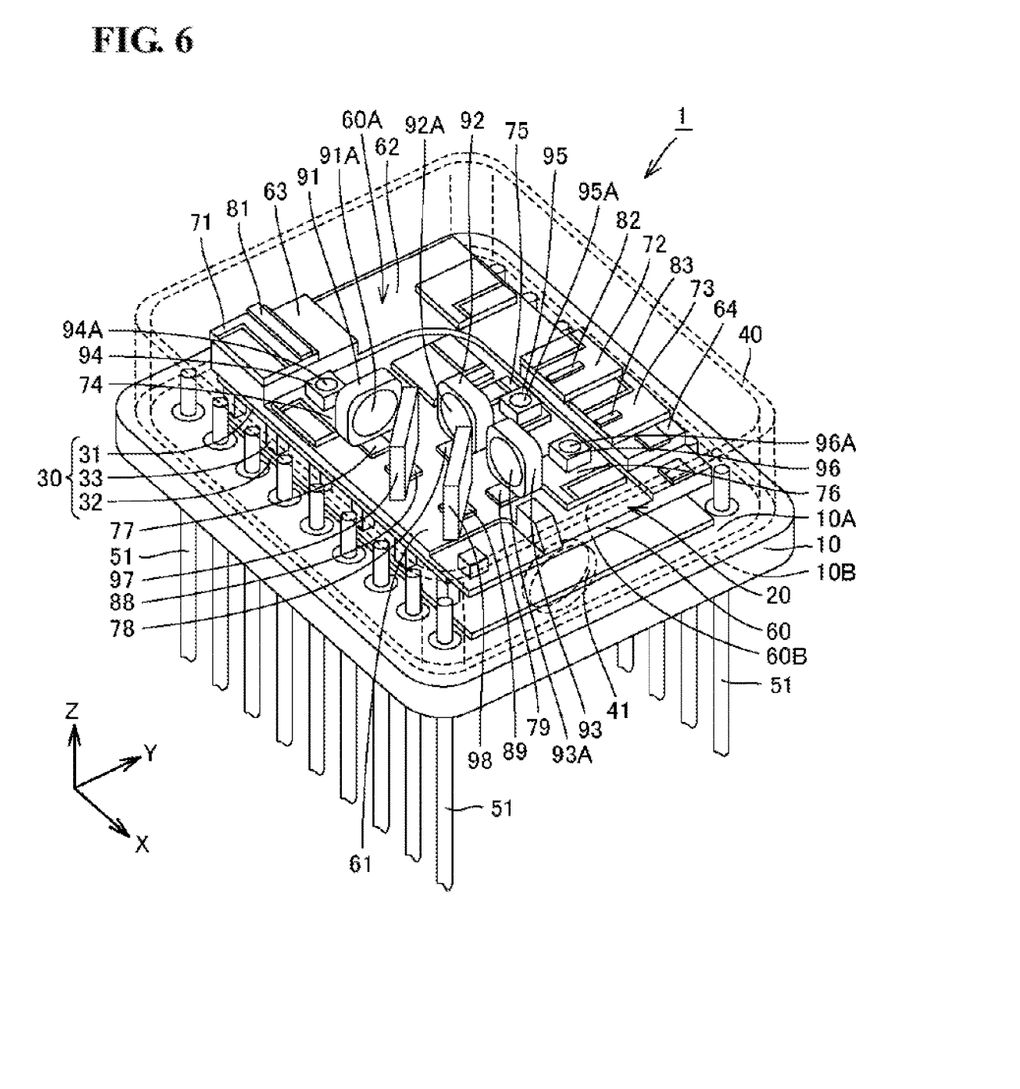
FIG. 6 is a schematic perspective view illustrating the structure of an optical module according to Embodiment 2.

Referring to FIG. 6 and FIG. 2, an optical module 1 according to this embodiment basically has the same structure and provides the same advantages as in Embodiment 1. However, the optical module 1 according to Embodiment 2 is different from Embodiment 1 in that it further includes an electronic cooling module 30.

Specifically, referring to FIG. 6, the optical module 1 according to Embodiment 2 further includes the electronic cooling module 30 disposed between the stem 10 and the light-forming part 20. The electronic cooling module 30 includes a heat absorption plate 31, a heat dissipation plate 32, and semiconductor columns 33 arranged between electrodes disposed on the heat absorption plate 31 and the heat dissipation plate 32. The heat absorption plate 31 and the heat dissipation plate 32 are formed of alumina, for example. The heat absorption plate 31 is disposed in contact with the other main surface 60B of the base plate 60. The heat dissipation plate 32 is disposed in contact with the one main surface 10A of the stem 10. In this embodiment, the electronic cooling module 30 is a Peltier module (Peltier device). A current is passed through the electronic cooling module 30, so that the heat in the base plate 60, which is in contact with the heat absorption plate 31, is transferred to the stem 10, which results in cooling of the base plate 60. As a result, an increase in the temperature of the red laser diode 81, the green laser diode 82, and the blue laser diode 83 is suppressed. Thus, the optical module 1 is usable even in an environment in which the temperature can reach a high value, for example, in the case of mounting the optical module 1 on an automobile. In addition, the temperature of the red laser diode 81, the green laser diode 82, and the blue laser diode 83 can be maintained within an appropriate range, to thereby accurately form light of a desired color.

Embodiment 3

Figure 7:
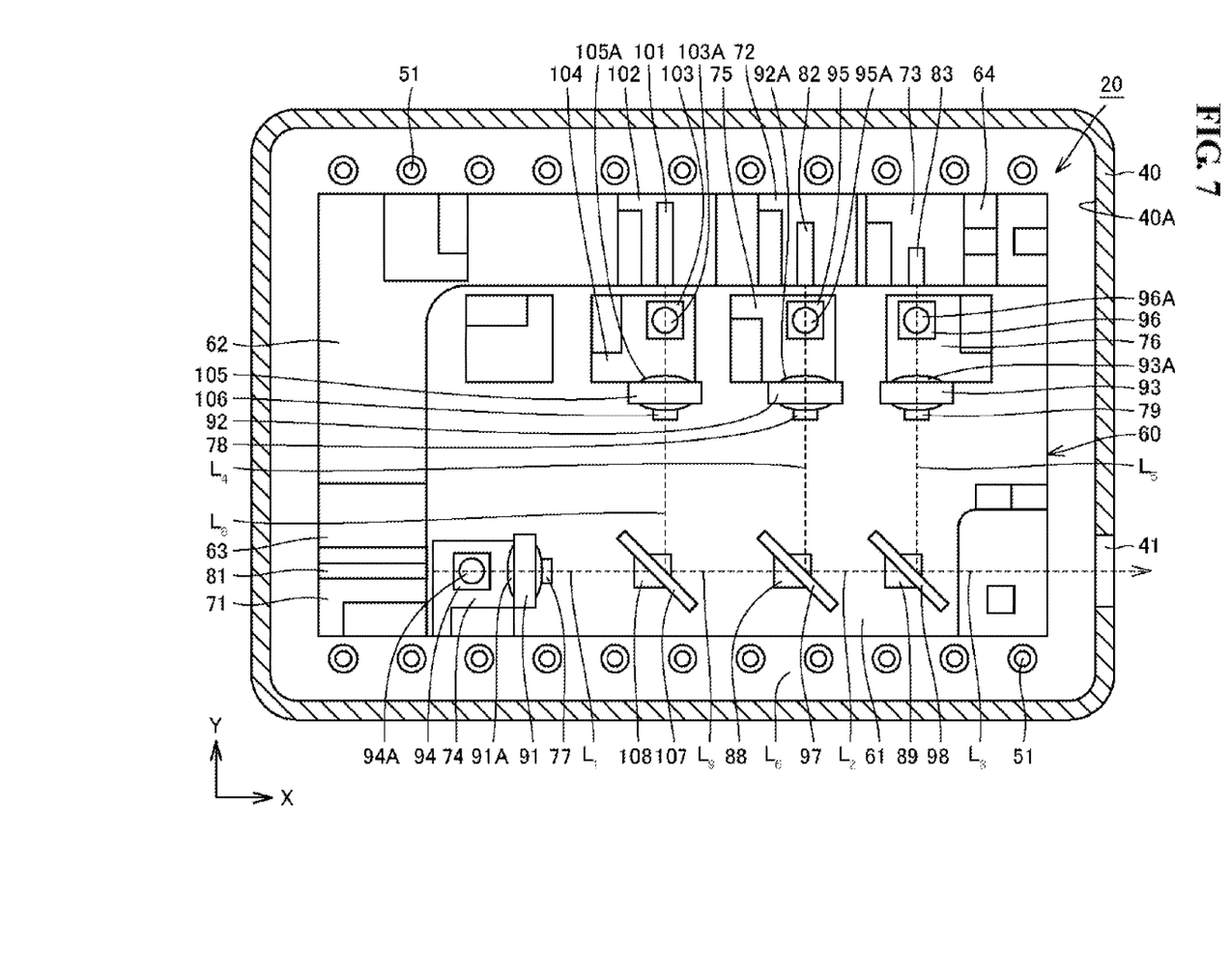
FIG. 7 is a schematic plan view illustrating the structure of an optical module according to Embodiment 3.

Hereinafter, Embodiment 3, which relates to an optical module according to still another embodiment of the present invention, will be described. Referring to FIG. 7 and FIG. 3, an optical module 1 according to this embodiment basically has the same structure and provides the same advantages as in Embodiment 1. However, the optical module 1 according to Embodiment 3 is different from Embodiment 1 in that the light-forming part 20 further includes a yellow laser diode 101 as a fourth semiconductor light-emitting device. Hereafter, the difference of Embodiment 3 from Embodiment 1 will be described.

Referring to FIG. 7, in Embodiment 3, a fourth submount 102 having the shape of a flat plate is disposed on the second chip mount region 64 formed on the base plate 60. When viewed from the second submount 72, the fourth submount 102 is disposed on a side opposite to the other side where the third submount 73 is disposed. On the fourth submount 102, the yellow laser diode 101 is disposed as a fourth semiconductor light-emitting device. The height of the optical axis of the yellow laser diode 101 is adjusted with the fourth submount 102 so as to be the same as the heights of the optical axes of the red laser diode 81, the green laser diode 82, and the blue laser diode 83.

On the base region 61 of the base plate 60, a seventh submount 104 is disposed. On the seventh submount 104, a fourth photodiode 103 is disposed as a fourth light-receiving device. The seventh submount 104 is used to adjust the height of the fourth photodiode 103 (distance to the optical axis of the yellow laser diode 101). The height of the fourth photodiode 103 is adjusted as in the first photodiode 94, the second photodiode 95, and the third photodiode 96 in the above-described embodiment. The fourth photodiode 103 is disposed at a position so as to directly receive light from the yellow laser diode 101. The fourth photodiode 103 is a photodiode configured to receive yellow light. The fourth photodiode 103 is disposed, in the emission direction of the yellow laser diode 101, between the yellow laser diode 101 and a fourth lens 105.

On the base region 61 of the base plate 60, a fourth lens holding part 106, which is a protrusion part, is formed. On the fourth lens holding part 106, the fourth lens 105 is disposed.

The fourth lens 105 has a lens portion 105A whose surface is a lens surface. The fourth lens 105 is molded in one piece in terms of the lens portion 105A and a region other than the lens portion 105A. The fourth lens holding part 106 is used to adjust the central axis of the lens portion 105A of the fourth lens 105, that is, the optical axis of the lens portion 105A, so as to align with the optical axis of the yellow laser diode 101. The fourth lens 105 converts, in terms of spot size, the light emitted from the yellow laser diode 101. The fourth lens 105 is used to convert the light emitted from the yellow laser diode 101 so as to have the same spot size as the light emitted from the red laser diode 81, the green laser diode 82, and the blue laser diode 83 and individually converted by the corresponding lenses.

On the base region 61 of the base plate 60, a third filter 107 is disposed. The third filter 107 has the shape of a flat plate whose main surfaces are parallel to each other. The third filter 107 is, for example, a wavelength selective filter. The third filter 107 is a dielectric multilayer film filter. In this embodiment, the first filter 97 transmits red light and yellow light, but reflects green light. The second filter 98 transmits red light, green light, and yellow light, but reflects blue light. The third filter 107 transmits red light, but reflects yellow light. As a result, the first filter 97, the second filter 98, and the third filter 107 multiplex light emitted from the red laser diode 81, the green laser diode 82, the blue laser diode 83, and the yellow laser diode 101. The third filter 107 is disposed on a third protrusion region 108, which is a protrusion part formed on the base region 61.

Referring to FIG. 7, the yellow laser diode 101, a light-receiving portion 103A of the fourth photodiode 103, the lens portion 105A of the fourth lens 105, and the third filter 107 are arranged in a line extending in the emission direction of light from the yellow laser diode 101 (arranged in the Y-axis direction). Thus, the emission direction of the red laser diode 81 intersects the emission directions of the yellow laser diode 101, the green laser diode 82, and the blue laser diode 83. More specifically, the emission direction of the red laser diode 81 is orthogonal to the emission directions of the yellow laser diode 101, the green laser diode 82, and the blue laser diode 83. The emission direction of the yellow laser diode 101 corresponds to the emission directions of the green laser diode 82 and the blue laser diode 83. More specifically, the emission direction of the yellow laser diode 101, the emission direction of the green laser diode 82, and the emission direction of the blue laser diode 83 are parallel to each other. The main surfaces of the third filter 107 incline with respect to the emission direction of light from the red laser diode 81. More specifically, the main surfaces of the third filter 107 incline at 45° with respect to the emission direction of light from the red laser diode 81 (the X-axis direction).

Hereinafter, operations of the optical module 1 according to this embodiment will be described. The optical module 1 according to this embodiment basically operates as in Embodiment 1. Hereafter, the differences from Embodiment 1 will be described. Referring to FIG. 7, yellow light emitted from the yellow laser diode 101 travels along an optical path $L_8$. At this time, a portion of the yellow light directly enters the light-receiving portion 103A of the fourth photodiode 103. Thus, the intensity of the yellow light emitted from the yellow laser diode 101 is determined; and the intensity of the yellow light is adjusted on the basis of the difference between the determined intensity of the light and the target intensity of emitted light. The yellow light having passed above the fourth photodiode 103, enters the lens portion 105A of the fourth lens 105, so that the light is converted in terms of spot size. Specifically, for example, the yellow light emitted from the yellow laser diode 101 is converted into collimated light. The yellow light having been converted in terms of spot size at the fourth lens 105, travels along the optical path $L_8$ and enters the third filter 107. The third filter 107 transmits red light, but reflects yellow light. Thus, yellow light is multiplexed with red light emitted from the red laser diode 81, and further travels along an optical path $L_9$. After that, as in Embodiment 1, the light is multiplexed with green light at the first filter 97, and multiplexed with blue light at the second filter 98.

In this way, light formed by multiplexing red light, yellow light, green light, and blue light is outputted through the output window 41 of the cap 40. Note that, in the optical module 1 according to this embodiment, light emitted from the yellow laser diode 101 is directly received by the fourth photodiode 103, which is disposed between the yellow laser diode 101 and the fourth lens 105. Thus, the intensity of yellow light as well as the intensities of red light, green light, and blue light are accurately determined, and the intensities of the light are adjusted with a high accuracy.

As a result, red light, green light, blue light, and also yellow light in a desired intensity ratio are accurately multiplexed, to thereby enable better representation of colors.

Incidentally, the submounts are formed of a material that has a thermal expansion coefficient similar to the thermal expansion coefficients of devices or the like mounted on the submounts. The submounts are formed of, for example, AlN, SiC, Si, or diamond. The material for forming the stem and the cap may be, for example, a material having a high thermal conductivity such as iron or copper, or may be, for example, AlN, CuW, or CuMo.

The above-described embodiments relate to cases of multiplexing light from three or four semiconductor light-emitting devices having different emission wavelengths. Alternatively, the number of semiconductor light-emitting devices may be one or two, or five or more. The above-described embodiments relate to cases of employing laser diodes as semiconductor light-emitting devices. Alternatively, the semiconductor light-emitting devices may be light-emitting diodes, for example. The above-described embodiments relate to examples of employing wavelength selective filters as the first filter 97, the second filter 98, and the third filter 107. Alternatively, these filters may be polarization synthesizing filters, for example.

Embodiments disclosed herein are mere examples in all respects and should be understood as being non-limitative in any perspective. The scope of the present invention is defined not by the above-described description, but by Claims. The scope of the present invention is intended to embrace all the modifications within the meaning and range of equivalency of the Claims.

INDUSTRIAL APPLICABILITY

An optical module according to the present application is advantageously applicable to, in particular, optical modules in which the intensities of light emitted from semiconductor light-emitting devices need to be adjusted with a high accuracy.

REFERENCE SIGNS LIST

1 optical module
2 light
2A and 2B regions
2C optical axis
10 stem
10A one main surface
10B the other main surface
20 light-forming part
30 electronic cooling module
31 heat absorption plate
32 heat dissipation plate
33 semiconductor columns
40 cap
40A inner wall surface
41 output window
51 lead pins
60 base plate
60A one main surface
60B the other main surface
61 base region
62 chip mount region
63 first chip mount region
64 second chip mount region
71 first submount
72 second submount
73 third submount
74 fourth submount
75 fifth submount
76 sixth submount
77 first lens holding part
78 second lens holding part
79 third lens holding part
81 red laser diode
82 green laser diode
82A emission portion
83 blue laser diode
88 first protrusion region
89 second protrusion region
91 first lens
92 second lens
93 third lens
91A, 92A, and 93A lens portions
94 first photodiode
95 second photodiode
96 third photodiode
94A, 95A, and 96A light-receiving portions
97 first filter
98 second filter
101 yellow laser diode
102 fourth submount
103 fourth photodiode
103A light-receiving portion
104 seventh submount
105 fourth lens
105A lens portion
106 fourth lens holding part
107 third filter
108 third protrusion region

The invention claimed is:

1. An optical module comprising:
a light-forming part configured to form light; and
a protective member that includes an output window configured to transmit light from the light-forming part and that is disposed so as to surround the light-forming part,
wherein the light-forming part includes
a base member,
a semiconductor light-emitting device mounted on the base member,
a lens mounted on the base member and configured to convert, in terms of spot size, light emitted from the semiconductor light-emitting device, and
a light-receiving device that is mounted on the base member, that is disposed, in an emission direction of the semiconductor light-emitting device, between the semiconductor light-emitting device and the lens, and that is configured to directly receive light from the semiconductor light-emitting device.

2. The optical module according to claim 1, wherein the light-forming part includes
a plurality of the semiconductor light-emitting devices mounted on the base member,
a plurality of the lenses mounted on the base member and disposed so as to individually correspond to the plurality of semiconductor light-emitting devices,
the light-receiving device mounted on the base member and disposed so as to correspond to at least one semiconductor light-emitting device of the plurality of semiconductor light-emitting devices, and a filter mounted on the base member and configured to multiplex light from the plurality of semiconductor light-emitting devices.

3. The optical module according to claim 2, wherein the plurality of semiconductor light-emitting devices include a semiconductor light-emitting device configured to emit red light, a semiconductor light-emitting device configured to emit green light, and a semiconductor light-emitting device configured to emit blue light.

4. The optical module according to claim 1, wherein the light-receiving device is disposed at a position so as to receive, of light emitted from the at least one semiconductor light-emitting device, light in a region other than a region where light is converted in terms of spot size by the lens corresponding to the at least one semiconductor light-emitting device.

5. The optical module according to claim 4, wherein the light-receiving device is disposed at a position where light emitted from the at least one semiconductor light-emitting device is received to provide a photocurrent of 1 µA or more.

6. The optical module according to claim 1, wherein the semiconductor light-emitting device is a laser diode.

7. The optical module according to claim 1, wherein the light-forming part further includes an electronic cooling module disposed so as to be in contact with the base member.

* * * * *